(12) United States Patent
Okazaki (10) Patent No.: US 6,768,580 B2
(45) Date of Patent: Jul. 27, 2004

(54) OPTICAL DIRECT AMPLIFIER DEVICE (75) Inventor: Hideya Okazaki, Tokyo (JP)

(73) Assignee: NEC Corporation, Tokyo (JP)

(*) Notice: Subject to any disclaimer, the term of this patent is extended or adjusted under 35 U.S.C. 154(b) by 50 days.

(21) Appl. No.: 10/187,986

(22) Filed: Jul. 3, 2002

(65) Prior Publication Data
US 2003/0007241 A1 Jan. 9, 2003

(30) Foreign Application Priority Data
Jul. 4, 2001 (JP) ........................... 2001-202848

(51) Int. Cl.[7] ................................. H01S 3/00

(52) U.S. Cl. .................. 359/341.2; 359/341.4

(58) Field of Search ............... 359/341.4, 341.2

(56) References Cited

U.S. PATENT DOCUMENTS 5,737,105 A * 4/1998 Ohta et al. .................. 359/179
5,801,878 A * 9/1998 Bourret et al. ............. 359/341
6,259,554 B1 * 7/2001 Shigematsu et al. ........ 359/337

* cited by examiner

Primary Examiner—Mark Hellner
(74) Attorney, Agent, or Firm—McGinn & Gibb, PLLC (57) ABSTRACT An optical direct amplifier device can detect failure of an excitation light source without using an electric circuit even when a monitoring system of the optical direct amplifier device based on a line turning back is employed. The optical direct amplifier device includes first and second optical amplifiers respectively amplifying signal lights of first and second transmission path. The optical direct amplifier device has a monitoring circuit branching only monitoring light wavelength of different from a wavelength of the signal lights and extracting means for extracting a part of an excitation light incided to the optical amplifiers.

12 Claims, 5 Drawing Sheets

OPTICAL DIRECT AMPLIFIER DEVICE

BACKGROUND OF THE INVENTION

1. Field of the Invention

The present invention relates generally to an optical direct amplifier device. More particularly, the invention relates to a monitoring circuit of an optical direct amplifier device.

2. Description of the Related Art

Figure 5:
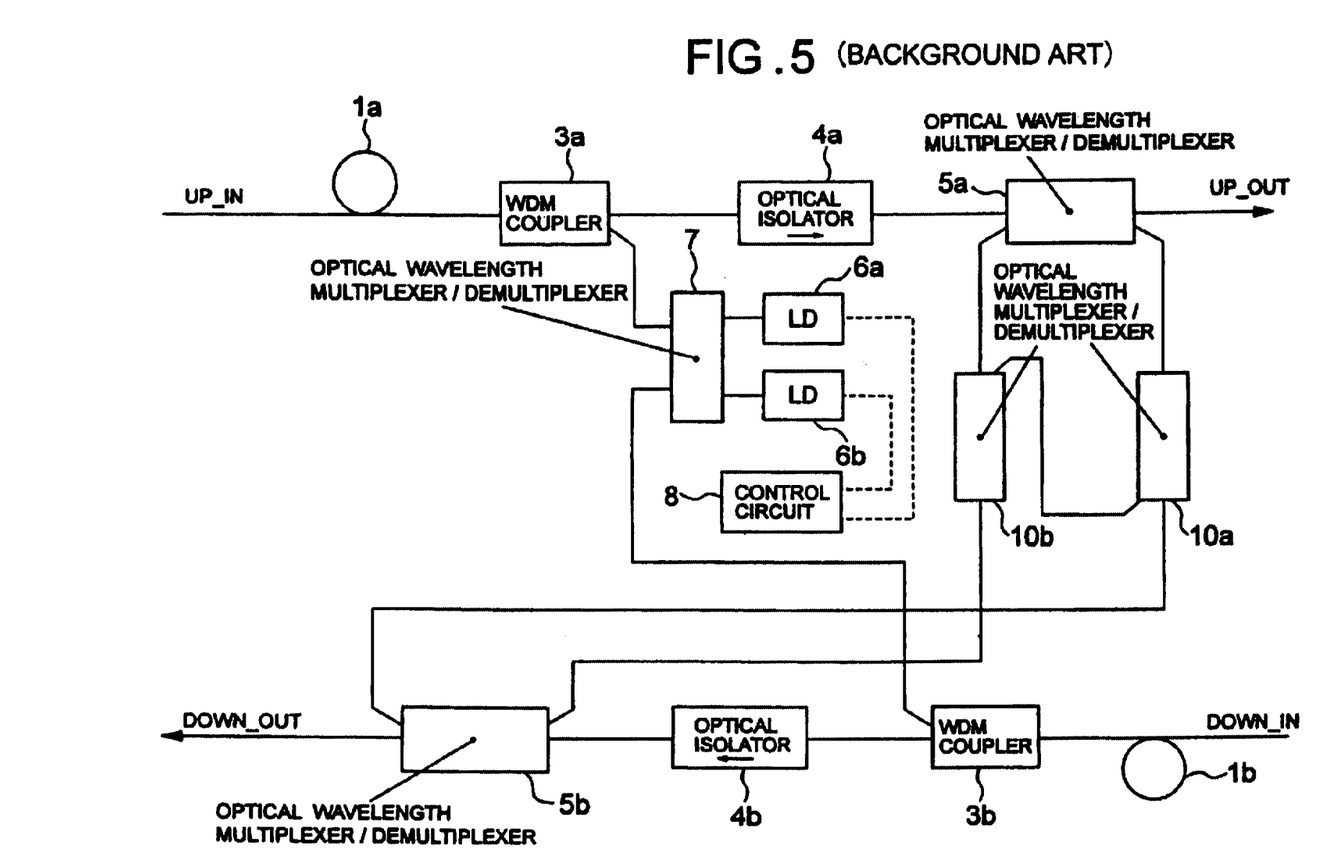
FIG. 5 is a schematic block diagram of a basic circuit showing the construction of a conventional optical direct amplifier device.

In the conventional optical direct amplifier device as illustrated in FIG. 5, a rare-earth added fiber 1a, a WDM (Wavelength Division Multiplexing) coupler 3a, an optical isolator 4a, an optical wavelength multiplexer/demultiplexer 5a are connected in sequential order from an uplink signal input end to reach an uplink signal output end. Similarly, a rare-earth added fiber 1b, a WDM coupler 3b, an optical isolator 4b, and an optical wavelength multiplexer/demultiplexer 5b are connected in sequential order from a downlink signal input end to reach a downlink output end.

Laser diodes (LD) 6a and 6b are connected to a control circuit B so that outputs thereof are controlled by the control circuit 8. The laser diodes 6a and 6b are connected to two input ends of the optical wavelength multiplexer/demultiplexer 7. Two output ends of the optical wavelength multiplexer/demultiplexer 7 are connected to input ends, other than input/output paths, of the WDM couplers 3a and 3b, respectively.

On the other hand, two branched ports of the optical wavelength multiplexer/demultiplexer 5a are connected to respective optical wavelength multiplexers/demultiplexers 10a and 10b. Also, two branched ports of the optical wavelength multiplexer/demultiplexer 5b are connected to respective optical wavelength multiplexers/demultiplexers 10a and 10b.

And, branched ports of optical wavelength multiplexers/demultiplexers 10a and 10b are connected with each other. In an up-link circuit and a down-link circuit of the foregoing optical direct amplifier, connecting portions of the optical wavelength multiplexers/demultiplexers 5a and 5b located downstream side of the optical isolators 4a and 4b form the monitoring circuit.

Monitoring of the optical direct amplifier device in an optical direct amplifier system employs a method to transmit a monitoring signal from a terminal station and returning a part of the optical signal within the optical direct amplifier device to the opposite side line (e.g. from the up-link line to the down-link line) and to receive the monitoring signal turned back and returned by the terminal station. In general, there has been employed a method for detecting in the optical direct amplifier device having an abnormality of optical output based on a lower magnitude of the returned monitoring signal. However, in the monitoring circuit of the conventional optical direct amplifier device, when one of the laser diodes 6a and 6b in FIG. 5 is turned OFF, lowering the magnitude of the monitoring signal, output of the optical direct amplifier device can be small causing difficulty in detecting an abnormality of optical output in the optical direct amplifier device with certain characteristics of the rare earth added fibers 1a and 1b or certain monitoring signal wavelength.

SUMMARY OF THE INVENTION

The present invention has been Worked out in view of the problem set forth above. Therefore, it is an object of the present invention to provide an optical direct amplifier device which can detect failure of an excitation light source without using an electric circuit, even when a monitoring system of the optical direct amplifier device based on a line turning back is employed.

According to one aspect of the present invention, an optical direct amplifier device including first and second optical amplifiers respectively amplifying signal lights of first and second transmission path, comprises:

a monitoring circuit branching only monitoring light of a wavelength different from a wavelength of the signal lights; and extracting means for extracting a part of an excitation light incident on the optical amplifiers.

Namely, the optical direct amplifier device of the present invention is characterized by a capability of performing failure detection of the excitation light source of the high precision optical direct amplifier device in the optical direct amplifier system.

In the preferred construction, each of first and second optical amplifiers which respectively amplifying signal lights of first and second transmission paths is formed of a series circuit of a rare earth added fiber, a wavelength division multiplexing coupler, an optical isolator and an optical wavelength multiplexer/demultiplexer, and further includes a monitoring circuit for branching only monitoring light of a wavelength different from the wavelength of the signal light and combining the branched light in the other transmission path, the optical wavelength multiplexer/demultiplexer extracting a part of the excitation light incident on the rare earth added fiber.

In the optical direct amplifier device according to the present invention, the rare earth added fiber amplifying the monitoring light is provided in the monitoring circuit. The excitation light incident on the rare earth added fiber is the excitation light extracted by the optical wavelength multiplexer/demultiplexer. The optical direct amplifier device includes a wavelength division multiplexer for combining the excitation light with the rare earth added fiber.

When one of two laser diodes fails, an excitation light power incident on the rare earth added fiber is reduced to make the loss of the rare earth added fiber greater than the normal state and thus to make lowering magnitude of the monitoring signal output of the optical direct amplifier device in the monitoring signal wavelength greater.

With the construction and operation set forth above, in the optical direct amplifier system employing the monitoring system of the optical direct amplifier device based on turning back of the line, failure of the excitation light source of the optical direct amplifier device can be detected with high precision without using an electric circuit.

The monitoring circuit may include optical amplifying means for taking a part of excitation light for the first and second optical amplifiers extracted by the extracting means as an excitation light source, and amplifying the monitoring optical wavelength.

The optical direct amplifier device may further comprise means for coupling a part of the excitation light for the first and second optical amplifiers extracted by the extracting means, with the optical amplifying means. The optical amplifying means may be set to have a gain in normal state of the excitation light source at less than or equal to 0 dB.

The extracting means may use the excitation light leaking from an extra port of a coupler for multiplexing the excitation light of the first and second optical amplifiers.

The monitoring circuit may be constructed by connecting one of ports of a selective wavelength reflector to selectively reflect the monitoring light wavelength to the optical amplifying means, and connecting the other port of the selective wavelength reflector to the extracting means.

The optical direct amplifier device may further comprise means provided downstream of the selective wavelength reflector for connecting one of the ports to the optical amplifier means and attenuating a signal other than the monitoring light wavelength passing through the selective wavelength reflector. One light emitting element of the excitation light for the first and second optical amplifiers may be provided for each of the first and second transmission paths, and a part of the excitation light of the light emitting element is supplied for each of the light amplifying means for the first and second transmission paths. In the alternative, a plurality of the light emitting elements of the excitation lights for the first and second optical amplifiers may be provided for each of the first and second transmission paths, and parts of the excitation lights of the light emitting elements are supplied in plural for each of light amplifying means for the first and second transmission paths. In the further alternative, one light emitting element of the excitation light for the first and second optical amplifiers may be provided for each of the first and second transmission paths, and a second wavelength division multiplexer is provided in each of first and second transmission paths, a part of excitation light of the light emitting element and a signal of the branched monitoring light wavelength are combined by the second wavelength division multiplexer to supply an output thereof to the optical amplifier means.

BRIEF DESCRIPTION OF THE DRAWINGS

The present invention will be understood more fully from the detailed description given hereinafter and from the accompanying drawings of the preferred embodiments of the present invention, which, however, should not be taken to be limitative of the invention, but are for explanation and understanding only.

In the drawings.

DESCRIPTION OF THE PREFERRED EMBODIMENT

The present invention will be discussed hereinafter in detail in terms of the preferred embodiments of an optical direct amplifier device according to the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure is not shown in detail in order to avoid unnecessary obscurity of the present invention.

Figure 1:
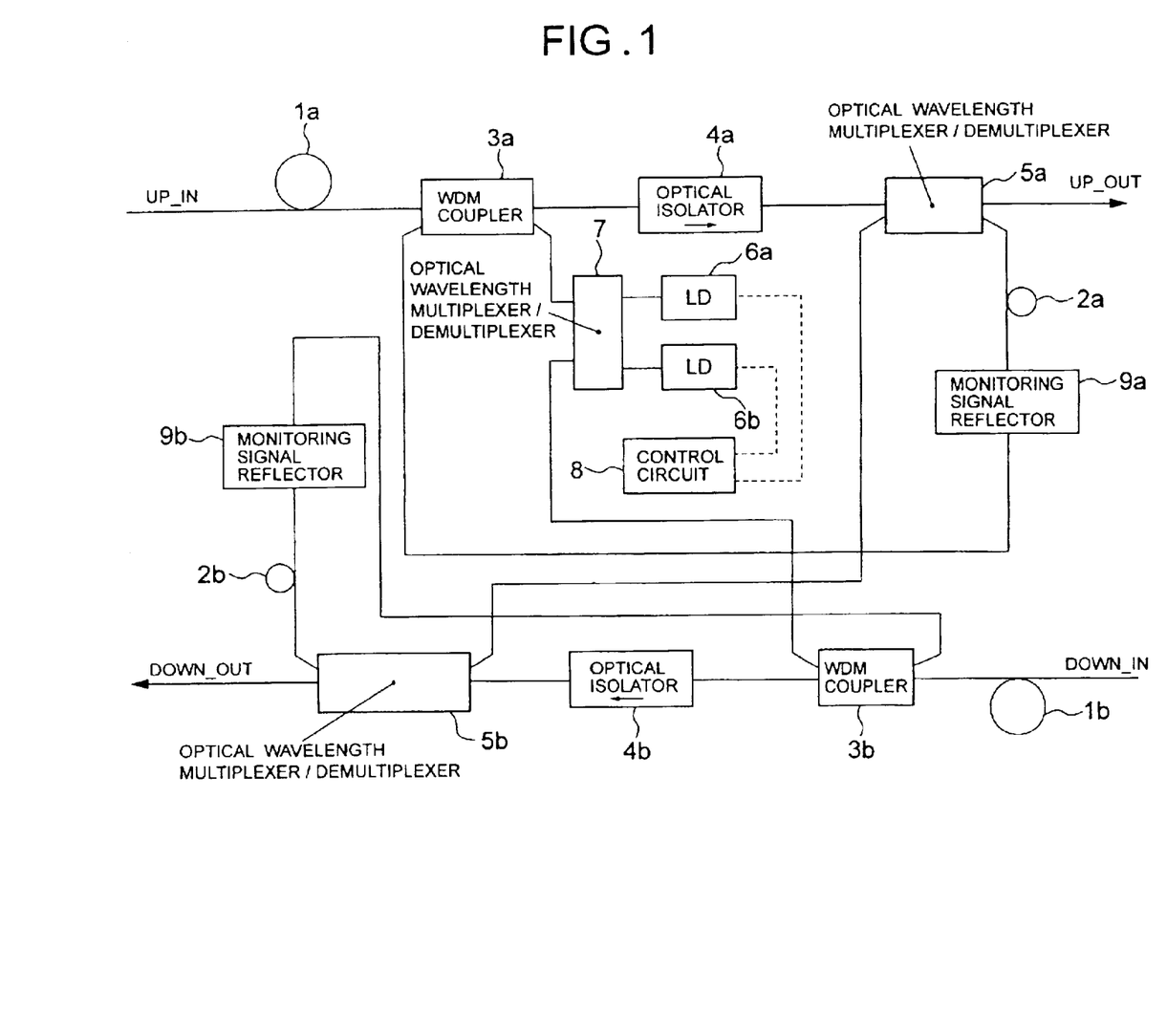
FIG. 1 is a schematic block diagram of a basic circuit showing a construction of one embodiment of an optical direct amplifier device according to the present invention.

FIG. 1 is a schematic block diagram showing a basic circuit showing a construction of one embodiment of an optical direct amplifier device according to the present invention. In FIG. 1, one embodiment of the optical direct amplifier device according to the invention includes rare earth added fibers 1a, 1b, 2a and 2b, WDM (Wavelength Division Multiplexing) couplers 3a and 3b, optical isolators 4a and 4b, optical wavelength multiplexers/demultiplexers 5a, 5b and 7, laser diodes (LD) 6a and 6b, a control circuit 8, and monitoring signal reflectors 9a and 9b.

In this embodiment of the optical direct amplifier according to the present invention, the rare earth added fiber 1a, the WDM coupler 3a, the optical isolator 4a, and the optical wavelength multiplexer/demultiplexer 5a are connected in sequential order from an up-link signal input end to reach an up-link signal output end.

Similarly, in one embodiment of the optical direct amplifier according to the present invention, the rare earth added fiber 1b, the WDM coupler 3b, the optical isolator 4b, and the optical wavelength multiplexer/demultiplexer 5b are connected in sequential order from a down-link signal input end to reach a down-link signal output end.

Here, the WDM couplers 3a and 3b are couplers for inputting an excitation light to the rare earth added fibers 1a and 1b. The laser diodes 6a and 6b are connected to the control circuit 8 so that the outputs thereof are controlled by the control circuit 8. The laser diodes 6a and 6b are connected to two input ends of the optical wavelength multiplexer/demultiplexer 7. Two output ends of the optical wavelength multiplexer/demultiplexer 7 are connected to another input end other than the foregoing input/output path.

On the other hand, in a monitoring circuit of the optical direct amplifier device formed by connecting optical parts, such as the optical wavelength multiplexers/demultiplexers 5a and 5b located on the downstream side of the up-link optical isolator 4a and the down-link optical isolator 4b, the rare earth added fibers 2a and 2b, which have variable gain depending upon excitation light power, and the monitoring signal reflectors 9a and 9b, formed by fiber grating or the like and located downstream side of the rare earth added fibers 2a and 2b, are connected to branching ports in a signal light direction of the optical wavelength multiplexers/demultiplexers 5a and 5b. On the other hand, by connecting the branching ports of the WDM couplers 3a and 3b in the exciting direction to the downstream side of respective monitoring signal reflectors 9a and 9b, the excitation light is incident on the rare earth added fibers 2a and 2b. Furthermore, the branching ports of the optical wavelength multiplexers/demultiplexers 5a and 5b in an anti-signal light direction are connected with each other.

Operation of this embodiment of the optical direct amplifier device according to the present invention will be discussed with reference to FIG. 1. In this embodiment of the optical direct amplifier device according to the present invention, excitation light outputs from the laser diodes 6a and 6b are multiplexed and demultiplexed in the optical wavelength multiplexer/demultiplexer 7 to be incident on the up-link rare earth added fiber 1a and the down-link rare earth added fiber 1b in an opposite direction to the signal. By this operation, the optical signal incident from the input end is amplified via the rare earth added fibers 1a and 1b to be output from the output end. At this time, respective laser diodes 6a and 6b are controlled by the outputs of the control circuit 8.

The monitoring signal of the up-link system input from UP_IN side is branched by the optical wavelength multiplexer/demultiplexer 5a. After passing the rare earth added fiber 2a, the branched monitoring signal is reflected by the monitoring signal reflector 9a and is output from the DOWN_OUT via the optical wavelength multiplexer/demultiplexer 5b. The monitoring signal of the down-link system input from DOWN_IN side is branched by the optical wavelength multiplexer/demultiplexer 5b. After passing through the rare earth added fiber 2b, the branched monitoring signal is reflected by the monitoring signal reflector 9b to be output from UP_OUT via the optical wavelength multiplexer/demultiplexer 5a.

Among excitation light incident on the rare earth added fibers 1a and 1b, the excitation lights from the branching side from the WDM couplers 3a and 3b respectively pass through the monitoring signal reflectors 9a and 9b to be incident on the rare earth added fibers 2a and 2b. By this operation, the rare earth added fibers 2a and 2b become optical amplifiers. Gains of the branched excitation lights of the rare earth added fibers 2a and 2b are preliminarily set certain value (e.g. 0 dB).

Here, consideration is given to the case in which the output of one of two laser diodes 6a and 6b becomes OFF due to failure. In this case, the excitation light output from the optical wavelength multiplexer/demultiplexer 7 is reduced. Accordingly, the excitation lights branched from the WDM couplers 3a and 3b are also reduced to reduce the gains of the rare earth added fibers 2a and 2b (e.g. −3 dB). Thus, the passing loss of the return path (for example, return path from the up-link line to the down-link line) in the monitoring circuit becomes greater than that in the normal state.

Monitoring of the optical direct amplifier device in the optical direct amplifier system including a monitoring circuit based on reflecting back is performed employing a method in which the monitoring signal from a not shown end station is transmitted, and a part of the optical signal is reflected to the opposite side line in the optical direct amplifier device and the reflected monitoring signal is received at the end terminal. In general, the optical direct amplifier device causing an abnormality in optical output is detected based on the lower magnitude of the monitoring signal output of the optical direct amplifier device in the monitoring signal wavelength.

In one embodiment of the optical direct amplifier device according to the present invention, high precision failure detection of the optical direct amplifier device becomes possible due to a much lower magnitude of the monitoring signal output of the optical direct amplifier device causing failure.

As set forth above, since the rare earth added fibers, means for branching the excitation light and means for applying the excitation light are connected to the monitoring circuit of the optical direct amplifier device, if failure is caused in one of a plurality of laser diodes 6a and 6b, the excitation light power incident on the rare earth added fibers in the monitoring circuit is reduced to make the passing loss greater than that in the normal state to enlarge or enhance the lowering magnitude of the monitoring signal output of the optical direct amplifier device by turning back. Therefore, high precision failure detection of the excitation light source of the optical direct amplifier device in the optical direct amplifier system can be obtained by employing the monitoring system of the optical direct amplifier device based on reflection.

On the other hand, comparing the conventional optical direct amplifier device and one embodiment of the optical direct amplifier device of the present invention, the number of additional parts becomes two at the minimum (basically, the rare earth added fibers 2a and 2b ), and addition of the electrical circuit becomes unnecessary, additional circuits required in connection with enhancing of precision in failure detection of the optical direct amplifier device can be reduced.

Figure 2:
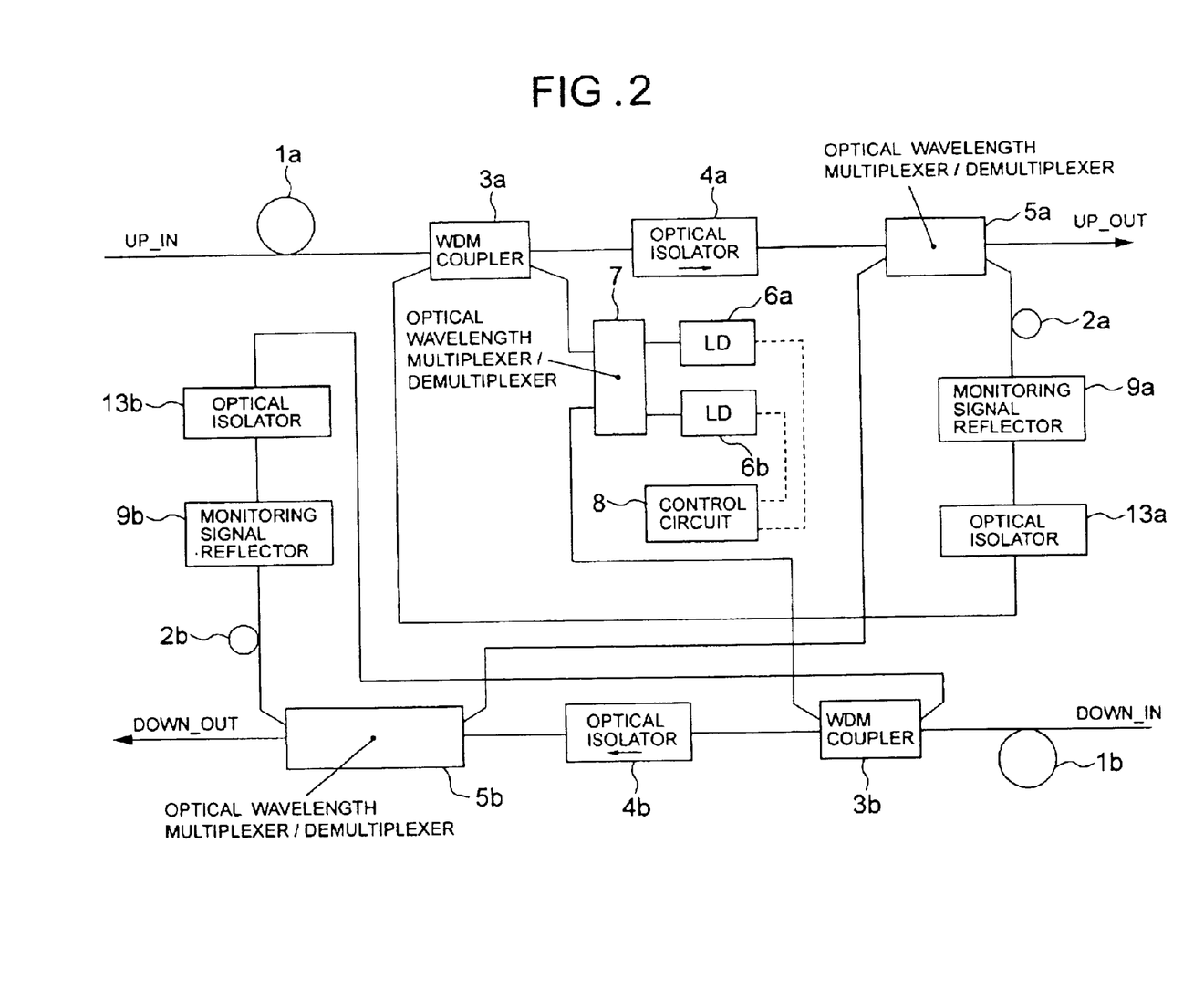
FIG. 2 is a schematic block diagram of a basic circuit showing a construction of another embodiment of an optical direct amplifier device according to the present invention.

FIG. 2 is a schematic block diagram of the basic circuit showing the construction of another embodiment of the optical direct amplifier device according to the present invention. In FIG. 2, the embodiment of the optical direct amplifier device according to the present invention is similar in construction as to the embodiment of the optical direct amplifier device according to the present invention illustrated in FIG. 1 except that isolators 13a and 13b, which pass the signals from the WDM couplers 3a and 3b only in the excitation incident direction, are connected downstream of the monitoring signal reflectors 9a and 9b. Like elements to those in the former embodiment will be identified by like reference numerals and the construction and operation of such common elements are also similar to the former embodiment. Therefore, detailed description of such common elements will be eliminated for avoiding redundant disclosure and whereby to keep the disclosure simple enough to facilitate clear understanding of the present invention.

In the FIG. 2 embodiment of the optical direct amplifier device according to the present invention, the optical isolators 13a and 13b which pass the signals only in the incident direction of the excitation light from the WDM couplers 3a and 3b, are connected at positions downstream of the monitoring signal reflectors 9a and 9b.

By connecting these optical isolators 13a and 13b, the signals other than the monitoring signal wavelength passing through the monitoring signal reflectors 9a and 9b can be attenuated. On the other hand, the optical isolators 13a and 13b may be optical filters passing only excitation lights. This embodiment of the optical direct amplifier device according to the present invention also achieves a similar effect as that achieved by the FIG. 1 embodiment of the present invention.

Figure 3:
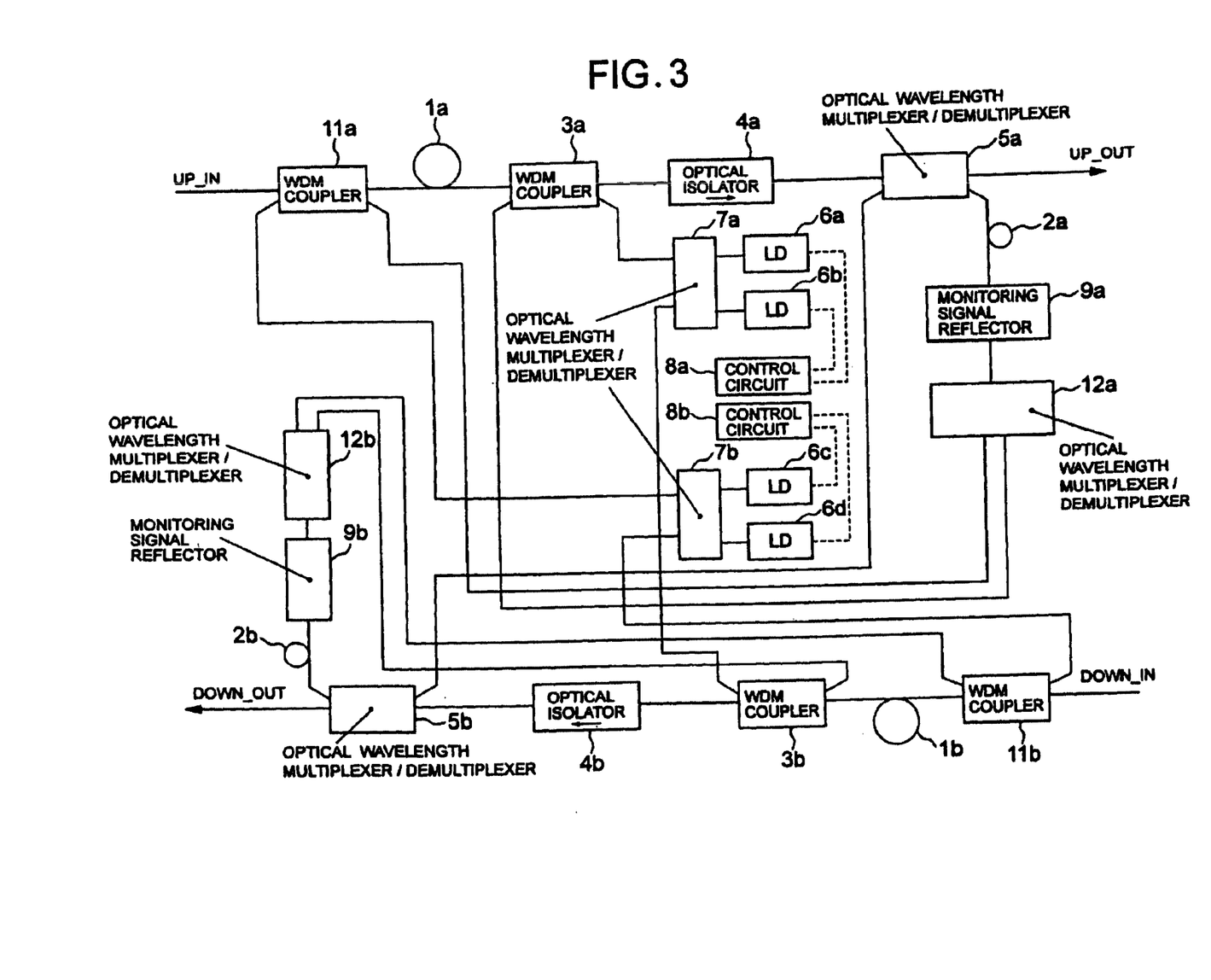
FIG. 3 is a schematic block diagram of a basic circuit showing a construction of a further embodiment of an optical direct amplifier device according to the present invention.

FIG. 3 is a schematic block diagram of the basic circuit showing the construction of a further embodiment of the optical direct amplifier device according to the present invention. In FIG. 3, the further embodiment of the optical direct amplifier device according to the present invention multiplexes and demultiplexes the excitation light outputs from the laser diodes 6a and 6b with an optical wavelength multiplexer/demultiplexer 7a. The multiplexed/demultiplexed output of the optical wavelength multiplexer/demultiplexer 7a is applied to the up-link rare earth added fiber 1a and the down-link rare earth added fiber 1b from the opposite direction as the respective signal by the WDM couplers 3a and 3b. On the other hand, the excitation light outputs from the laser diodes 6c and 6d are multiplexed/demultiplexed by the optical wavelength multiplexer/demultiplexer 7b. The multiplexed/demultiplexed outputs of the optical wavelength multiplexer/demultiplexers 7a and 7b are applied to the up-link rare earth added fiber 1a and the down-link rare earth added fiber 1b from the same direction as the signal by the WDM couplers 11a and 11b. Except for those set forth above, the shown embodiment of the optical direct amplifier device is similar to the FIG. 1 embodiment of the present invention set forth above. Like elements to those in the FIG. 1 embodiment will be identified by like reference numerals and the construction and operation of such common elements are also similar to the FIG. 1 embodiment. Therefore, detailed description of such common elements will be eliminated for avoiding redundant disclosure and whereby to keep the disclosure simple enough to facilitate clear understanding of the present invention.

In the FIG. 3 embodiment of the optical direct amplifier device according to the present invention, the excitation light outputs from the laser diodes 6a and 6b are multiplexed and demultiplexed by the optical wavelength multiplexer/demultiplexer 7a. The multiplexed and demultiplexed excitation light output from the optical wavelength multiplexer/demultiplexer 7a is applied to the up-link rare earth added fiber 1a and the down-link rare earth added fiber 1b in the direction opposite to the signal in the WDM couplers 3a and 3b. On the other hand, the excitation light output from the laser diodes 6c and 6d are multiplexed and demultiplexed by the optical wavelength multiplexer/demultiplexer 7b and then applied to the up-link rare earth added fiber 1a and the down-link rare earth added fiber 1b in the same direction as the signal in the WDM couplers 11a and 11b.

With the operation set forth above, the optical signal received from the input end in the FIG. 3 embodiment of the optical direct amplifier device according to the present invention, is amplified through the rare earth added fibers 1a and 1b and output from the output end. At this time, respective laser diodes 6a and 6b are controlled outputs by control circuits 8a and 8b.

The monitoring signal of the up-link system input from UP_IN side is branched by the optical wavelength multiplexer/demultiplexer 5a, passed through the rare earth added fiber 2a, and then reflected by the monitoring signal reflector 9a to be output from DOWN_OUT through the optical wavelength multiplexer/demultiplexer 5b. The monitoring signal of the down-link system input from DOWN_IN side is branched by the optical wavelength multiplexer/demultiplexer 5b, passed through the rare earth added fiber 2b, reflected by the monitoring signal reflector 9b and then output from UP_OUT through the optical wavelength multiplexer/demultiplexer 5a.

On the other hand, among the excitation light applied to the rare earth added fibers 1a and 1b, the excitation lights from the branched side of the WDM couplers 3a, 11a and the WDM couplers 3b, 11b are multiplexed by respective optical wavelength multiplexers/demultiplexers 12a and 12b and then applied to the rare earth added fibers 2a and 2b through the monitoring signal reflectors 9a and 9b. By this operation, the rare earth added fibers 2a and 2b serve as optical amplifiers. The gains of the rare earth added fibers 2a and 2b by the branched excitation lights are preliminarily set to be a certain value (e.g. 0 dB).

Here, consideration is given for the case where failure is caused in one of the four laser diodes 6a to 6d to turn the output thereof OFF. In this case, the excitation light output from the optical wavelength multiplexer/demultiplexer 7a or the optical wavelength multiplexer/demultiplexer 7b is lowered. Accordingly, the excitation lights branched from the WDM couplers 3a, 3b or the WDM couplers 11a, 11b are also lowered to reduce the gains of the rare earth added fibers 2a and 2b (e.g. −3 dB). As a result, the passing loss of the turning reflected path (for example, the reflection path from the up-link line to the down-link line) in the monitoring circuit becomes greater than that in the normal condition.

Similarly, when failure in two of the four laser diodes 6a to 6d turns the outputs thereof OFF, the gains of the rare earth added fibers 2a and 2b are reduced (e.g. −5 dB). On the other hand, when failure in three of the four laser diodes 6a to 6d turns the outputs thereof OFF, the gains of the rare earth added fibers 2a and 2b are further reduced (e.g. −6 dB) to make the passing loss of the reflected path in the monitoring circuit (for example, reflecting from the up-link line to the down-link line) greater than normal state.

By constructing as set forth above, even when there are three or more excitation light sources, in the FIG. 3 embodiment of the optical direct amplifier device, a similar effect to the FIG. 1 and FIG. 2 embodiments of the present invention can be achieved.

Figure 4:
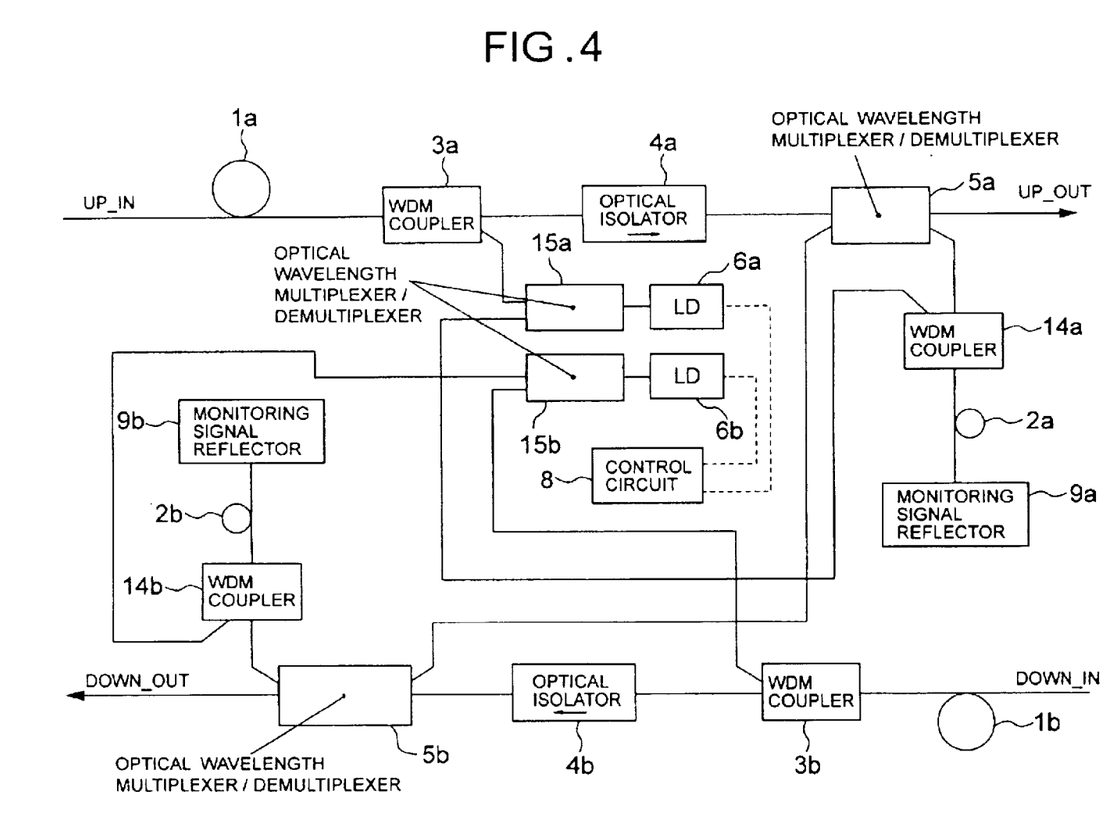
FIG. 4 is a schematic block diagram of a basic circuit showing a construction of a still further embodiment of an optical direct amplifier device according to the present invention.

FIG. 4 is a block diagram of a basic circuit showing the construction of a still further embodiment of the optical direct amplifier device according to the present invention. In FIG. 4, the still further embodiment of the optical direct amplifier device according to the present invention branches the excitation light outputs from the laser diodes 6a and 6b by respective optical wavelength multiplexers/demultiplexers 15a and 15b to apply one of the branched excitation light outputs to the up-link rare earth added fiber 1a and the down-link rare earth added fiber 1b in the opposite direction from the signal by respective WDM couplers 3a and 3b, and to apply the other of the branched excitation light outputs to the rare earth added fibers 2a and 2b of the monitoring circuit by respective WDM couplers 14a and 14b. The other construction is the same as in the embodiment of the present invention shown in FIG. 1. Like elements to those in the FIG. 1 embodiment will be identified by like reference numerals, and the construction and operation of such common elements are also similar to the FIG. 1 embodiment. Therefore, detailed description of such common elements will be omitted to avoid redundant disclosure and to keep the disclosure simple enough to facilitate clear understanding of the present invention.

In the FIG. 4 embodiment of the optical direct amplifier device according to the present invention, the excitation light outputted from the laser diodes 6a and 6b is demultiplexed by respective optical wavelength multiplexers/demultiplexers 15a and 15b to apply one of the branched excitation light outputs to the up-link rare earth added fiber 1a and the down-link rare earth added fiber 1b in the opposite direction to the signal by respective WDM couplers 3a and 3b, and to apply the other of the branched excitation light outputs to the rare earth added fibers 2a and 2b of the monitoring circuit by respective WDM couplers 14a and 14b.

At this time, the outputs of respective laser diodes 6a and 6b are controlled by the control circuits 8a and 8b. The gain of the optical amplifier in the monitoring circuit having the rare earth added fibers 2a and 2b is preliminarily set at a particular value (e.g. 0 dB). By constructing as set forth above, the still FIG. 4 embodiment of the optical direct amplifier device achieves a similar effect to the FIG. 1 to FIG. 3 embodiments of the present invention.

As set forth above, with the present invention, in an optical direct amplifier device including first and second optical amplifiers respectively amplifying signal lights in first and second transmission paths, failure detection of the excitation light source can be achieved without using the electrical circuit even when the monitoring system of the optical direct amplifier device is based on reflection, by providing the monitoring circuit branching only the monitoring light wavelength of a wavelength different from the signal light and the extracting means for extracting a part of the excitation light incident on the rare earth added fibers forming the optical amplifier.

Although the present invention has been illustrated and described with respect to exemplary embodiments thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. An optical amplifying device, comprising first and second optical amplifiers for respectively amplifying first and second signal lights received on first and second transmission paths, respectively, from first and second signal sources, respectively, wherein:
   said first optical amplifier comprises a first reflector and a first optical wavelength multiplexer/demultiplexer, said first optical wavelength multiplexer/demultiplexer separating light of a first particular wavelength from the first signal light and applying the first separated light to said first reflector to be reflected thereby, returned to said first multiplexer/demultiplexer, and applied therefrom to a second multiplexer/demultiplexer, said second multiplexer/demultiplexer multiplexing the first separated light with the second signal light and applying the resulting light to the first signal source; and
   said second optical amplifier comprises a second reflector and said second optical wavelength multiplexer/demultiplexer, said second optical wavelength multiplexer/demultiplexer separating light of a second particular wavelength from the second signal light and applying the second separated light to said second reflector to be reflected thereby, returned to said second multiplexer/demultiplexer, and applied therefrom to said first multiplexer/demultiplexer, said first multiplexer/demultiplexer multiplexing the second separated light with the first signal light and applying the resulting light to the second signal source.

2. An optical direct amplifier device as set forth in claim 1, wherein each of said first and second optical amplifiers further comprises a series circuit of a rare earth added fiber, a wavelength division multiplexing coupler, and an optical isolator.

3. An optical direct amplifier device as set forth in claim 1, wherein:
   said first optical amplifier further comprises a first further optical amplifying means for amplifying the first separated light and providing the amplified first separated light to said first optical amplifier as a first excitation light; and
   said second optical amplifier further comprises a second further optical amplifying means for amplifying the second separated light and providing the amplified second separated light to said second optical amplifier as a second excitation light.

4. An optical direct amplifier device as set forth in claim 3, wherein:
   said first optical amplifier further comprises means for applying a part of the first separated light to said first further optical amplifying means; and
   said second optical amplifier further comprises means for applying a part of the second separated light to said second further optical amplifying means.

5. An optical direct amplifier device as set forth in claim 3, wherein each of said first and second further optical amplifying means has a gain in a normal state of the respective excitation light sources of less than or equal to 0 dB.

6. An optical direct amplifier device as set forth in claim 1, wherein:
   said first optical amplifier further comprises a coupler for providing first excitation light to be multiplexed with light of said first optical amplifier; and
   said second optical amplifier further comprises a second coupler for providing second excitation light to be multiplexed with light of said second optical amplifier.

7. An optical direct amplifier device as set forth in claim 3, wherein:
   said first reflector has a first port for selectively reflecting the first separated light to said first further optical amplifying means and a second port connected to said first optical multiplexer/demultiplexer; and
   said second reflector has a first port for selectively reflecting the second separated light to said second further optical amplifying means and a second port connected to said second optical multiplexer/demultiplexer.

8. An optical direct amplifier device as set forth in claim 7, wherein:
   said first optical amplifier further comprises means coupled to said first reflector, for attenuating light of a wavelength other than the first particular light wavelength; and
   said second optical amplifier further comprises means coupled to said second reflector, for attenuating light of a wavelength other than the second particular light wavelength.

9. An optical direct amplifier device as set forth in claim 3, further comprising first and second light emitting means for providing first and second excitation lights to said first and second optical amplifiers, wherein a part of the first and second excitation lights is supplied to each of said first and second optical amplifiers.

10. An optical direct amplifier device as set forth in claim 9, wherein each of said light emitting means comprises a plurality of light emitting elements.

11. An optical direct amplifier device as set forth in claim 9, wherein:
   said first optical amplifier further comprises a first additional wavelength division multiplexer for combining a part of the first excitation light with a signal from the first separated light and supplying the combined lights to said first further optical amplifying means; and
   said second optical amplifier further comprises a second additional wavelength division multiplexer for combining a part of the second excitation light with a signal from the second separated light and supplying the combined lights to said second further optical amplifying means.

12. An optical amplifying device, comprising first and second optical amplifiers for respectively amplifying first and second signal lights received on first and second transmission paths, respectively, from first and second signal sources, respectively, wherein each optical amplifier includes a reflector and a wavelength multiplexer/demultiplexer for separating a portion of the received signal light based on the wavelength of the received light and directing the separated portion of the received signal light to said reflector; said reflector reflecting the portion back to said wavelength multiplexer/demultiplexer as monitoring light; and said wavelength multiplexer/demultiplexer forwarding the monitoring light to the multiplexer/demultiplexer of the other optical amplifier to be combined with the signal light received by that optical amplifier and transmitted back to said respective signal source.

* * * * *